United States Patent
Liu

(10) Patent No.: US 11,965,797 B1
(45) Date of Patent: Apr. 23, 2024

(54) BIPOLAR TRANSISTOR TYPE MEMS PRESSURE SENSOR AND PREPARATION METHOD THEREOF

(71) Applicant: Wuxi Sencoch Semiconductor Co., Ltd., Jiangsu (CN)

(72) Inventor: Tongqing Liu, Jiangsu (CN)

(73) Assignee: Wuxi Sencoch Semiconductor Co., Ltd., Wuxi (CN)

(*) Notice: Subject to any disclaimer, the term of this patent is extended or adjusted under 35 U.S.C. 154(b) by 0 days.

(21) Appl. No.: 18/372,687

(22) Filed: Sep. 25, 2023

(30) Foreign Application Priority Data

Dec. 1, 2022 (CN) .......................... 202211528266.4

(51) Int. Cl.
*G01L 9/06* (2006.01)
*B81C 1/00* (2006.01)

(52) U.S. Cl.
CPC .......... *G01L 9/065* (2013.01); *B81C 1/00539* (2013.01); *B81C 2201/0133* (2013.01); *B81C 2201/016* (2013.01); *B81C 2201/0171* (2013.01)

(58) Field of Classification Search
CPC . G01L 19/147; G01L 9/0072; G01L 19/0645; G01L 19/0084; G01L 9/0042; G01L 19/0007; G01L 9/0073; G01L 13/025; G01L 19/0038; G01L 9/0075; G01L 9/0054; G01L 9/0055; G01L 19/04; G01L 19/148; G01L 7/00; G01L 7/04; G01L 19/14; G01L 19/0092; G01L 19/143; G01L 15/00; G01L 17/00; G01L 7/18; G01L 9/0051; G01L 9/065; G01L 9/12; G01L 9/0052; G01L 7/041; G01L 9/125; G01L 19/0618; G01L 19/0609; G01L 19/003; G01L 19/0627; G01L 19/0046;
(Continued)

(56) References Cited

U.S. PATENT DOCUMENTS 4,163,390 A * 8/1979 Rodder .................. A61B 5/08
600/537
2005/0130360 A1 6/2005 Zhan et al.

FOREIGN PATENT DOCUMENTS

CN 1599235 A 3/2005
CN 104062464 A 9/2014
(Continued)

OTHER PUBLICATIONS

Notice of Allowance of counterpart Chinese Patent Application No. 202211528266.4 dated May 24, 2023.
(Continued)

*Primary Examiner* — Andre J Allen

(57) ABSTRACT

The present disclosure discloses a bipolar transistor type MEMS pressure sensor and a preparation method thereof. The bipolar transistor type MEMS pressure sensor includes a thin film, a cantilever beam and a bipolar transistor. The bipolar transistor includes a base region, a collector region and an emitter region. The base region is configured to sense deformation of the thin film through a change in resistance value. For the bipolar transistor type MEMS pressure sensor of the disclosure, sensitivity of the sensor can be effectively improved without changing the performance indicators such as the measurement range and nonlinearity. Meanwhile, the bipolar transistor is used as a pressure-sensitive element, so that temperature drift of the sensor can be effectively inhibited.

7 Claims, 7 Drawing Sheets

(58) Field of Classification Search
CPC ......... G01L 7/16; G01L 19/0636; G01L 9/06; G01L 19/0023; G01L 7/084; G01L 9/007; G01L 9/0022; G01L 13/02; G01L 19/142; G01L 19/02; G01L 9/008; G01L 7/043; G01L 19/08; G01L 19/141; G01L 9/0002; G01L 19/0672; G01L 23/18; G01L 19/0681; G01L 9/006; G01L 11/02; G01L 19/0069; G01L 9/0077; G01L 7/082; G01L 19/12; G01L 27/005; G01L 23/10; G01L 9/0044; G01L 19/0015; G01L 21/12; G01L 7/063; G01L 19/146; G01L 27/002; G01L 27/007; G01L 9/0001; G01L 19/0654; G01L 9/0026; G01L 11/025; G01L 13/026; G01L 9/0047; G01L 9/045; G01L 11/00; G01L 9/0089; G01L 9/14; G01L 9/0025; G01L 11/008; G01L 13/00; G01L 19/00; G01L 9/16; G01L 19/0061; G01L 7/08; G01L 7/22; G01L 9/0019; G01L 9/0041; G01L 19/086; G01L 19/069; G01L 9/0076; G01L 9/08; G01L 21/00; G01L 19/083; G01L 9/0005; G01L 9/0035; G01L 1/18; G01L 9/04; G01L 9/10; G01L 9/0008; G01L 9/0016; G01L 11/006; G01L 19/06; G01L 1/12281; G01L 19/10; G01L 19/16; G01L 9/0048; G01L 9/0079; G01L 11/004; G01L 9/0027; G01L 9/00; G01L 9/0057; G01L 13/023; G01L 19/0663; G01L 7/048; G01L 9/0086; G01L 11/04; G01L 23/24; G01L 7/166; G01L 9/0091; G01L 1/02; G01L 19/145; G01L 1/20; G01L 11/002; G01L 27/00; G01L 7/182; G01L 9/0036; G01L 9/0039; G01L 9/0045; G01L 23/125; G01L 23/22; G01L 9/0061; G01L 9/0013; G01L 1/142; G01L 9/0092; G01L 1/2293; G01L 9/0033; G01L 9/0098; G01L 9/02; G01L 1/205; G01L 21/04; G01L 21/22; G01L 7/104; G01L 9/0007; G01L 9/0064; G01L 9/0083; G01L 7/24; G01L 9/0029; G01L 13/06; G01L 23/08; G01L 23/16; G01L 7/022; G01L 1/148; G01L 7/088; G01L 5/14; G01L 7/163; G01L 1/16; G01L 23/222; G01L 9/0085; G01L 9/025; G01L 21/14; G01L 1/2212; G01L 1/2287; G01L 9/0004; G01L 9/085; G01L 1/14; G01L 23/02; G01L 7/061; G01L 9/003; G01L 19/0076; G01L 9/002; G01L 9/0058; G01L 13/028; G01L 23/28; G01L 7/02; G01L 9/0095; G01L 1/62; G01L 1/2231; G01L 1/246; G01L 19/149; G01L 21/10; G01L 9/105; G01L 5/228; G01L 7/086; G01L 9/0038; G01L 7/024; G01L 7/12; G01L 9/0032; G01L 7/06; G01L 1/005; G01L 1/2206; G01L 1/2262; G01L 1/24; G01L 9/0082; G01L 1/146; G01L 1/26; G01L 11/06; G01L 13/021; G01L 19/144; G01L 7/187; G01L 23/26; G01L 27/02; G01L 1/125; G01L 23/00; G01L 9/0094; G01L 1/144; G01L 1/165; G01L 1/2268; G01L 21/34; G01L 23/221; G01L 7/068; G01L 7/102; G01L 7/20; G01L 9/0097; G01L 1/225; G01L 13/04; G01L 23/12; G01L 23/32; G01L 7/045; G01L 7/14; G01L 1/086; G01L 1/241; G01L 21/30; G01L 9/18; G01L 1/27; G01L 1/22; G01L 1/245; G01L 17/005; G01L 21/32; G01L 23/145; G01L 5/18; G01L 7/108; G01L 9/001; G01L 1/183; G01L 1/2218; G01L 5/0047; G01L 5/0076; G01L 9/0023; G01L 1/044; G01L 1/10; G01L 1/106; G01L 5/165; G01L 5/226; G01L 9/0017; G01L 9/005; G01L 9/0088; G01L 1/186; G01L 1/243; G01L 23/223; G01L 25/00; G01L 3/245; G01L 5/0038; G01L 5/0052; G01L 5/225; G01L 7/065; G01L 1/00; G01L 1/04; G01L 1/08; G01L 21/16; G01L 21/24; G01L 3/10; G01L 3/1485; G01L 5/0004; G01L 5/162; G01L 9/0014; G01L 1/103; G01L 1/2275; G01L 21/02; G01L 21/26; G01L 23/225; G01L 3/102; G01L 3/105; G01L 5/0028; G01L 5/0033; G01L 5/223; G01L 5/24; G01L 7/026; G01L 7/028; G01L 7/10; G01L 9/0011; G01L 1/083; G01L 1/12; G01L 1/242; G01L 1/247; G01L 1/255; G01L 2009/0069; G01L 21/08; G01L 21/36; G01L 23/04; G01L 23/14; G01L 3/103; G01L 5/00; G01L 5/102; G01L 5/133; G01L 5/1627; G01L 5/166; G01L 5/22; G01L 5/243; G01L 7/185; G01L 1/042; G01L 1/046; G01L 1/122; G01L 1/2225; G01L 1/2243; G01L 1/2256; G01L 1/248; G01L 2009/0066; G01L 2009/0067; G01L 2019/0053; G01L 21/06; G01L 23/06; G01L 23/085; G01L 23/30; G01L 3/00; G01L 3/06; G01L 3/1475; G01L 3/1492; G01L 3/18; G01L 3/24; G01L 3/242; G01L 5/0057; G01L 5/0061; G01L 5/08; G01L 5/10; G01L 5/101; G01L 5/108; G01L 5/167; G01L 5/171; G01L 5/28

USPC .................................................. 73/700–756

See application file for complete search history.

(56) References Cited

FOREIGN PATENT DOCUMENTS

| CN | 114275731 A | 4/2022 | |
|----|-------------|--------|---|
| EP | 0905475 A1 | 3/1999 | |
| JP | H10242162 A | 9/1998 | |
| RU | 187746 U1 * | 3/2019 | |
| RU | 187760 U1 * | 3/2019 | |
| RU | 195159 U1 * | 1/2020 | ............... G01L 9/04 |
| RU | 195160 U1 * | 1/2020 | ............... G01L 9/04 |

OTHER PUBLICATIONS

1st Office Action of counterpart Chinese Patent Application No. 202211528266.4 dated Jan. 11, 2023.
2nd Office Action of counterpart Chinese Patent Application No. 202211528266.4 dated May 9, 2023.

* cited by examiner

BIPOLAR TRANSISTOR TYPE MEMS PRESSURE SENSOR AND PREPARATION METHOD THEREOF

CROSS-REFERENCE TO RELATED APPLICATIONS

The present application claims priority of Chinese Patent Application No. 202211528266.4 filed on Dec. 1, 2022, which is hereby incorporated by reference in its entirety.

TECHNICAL FIELD

The disclosure belongs to the technical field of sensors, and particularly relates to a bipolar transistor type MEMS pressure sensor and a preparation method thereof.

BACKGROUND

MEMS piezoresistive pressure sensors have the advantages of small size, high sensitivity, good linearity, fast dynamic response, and are widely used in industrial production, aerospace, national defense and military, medical health fields. MEMS piezoresistive pressure sensors achieve pressure detection through sensitive elements disposed on pressure-sensitive thin films. For traditional MEMS piezoresistive pressure sensors, sensitivity is increased mainly by increasing the ratio of the area to thickness of the pressure-sensitive thin film and adjusting doping concentration of sensitive elements. However, as the ratio of the area to the thickness of the pressure-sensitive thin film of the sensor increases, the measurement range decreases and the linearity deteriorates. With the progress of society, the performance requirements of MEMS piezoresistive pressure sensors in various fields are becoming increasingly high. The contradiction between sensitivity, measurement range and linearity of traditional MEMS piezoresistive pressure sensors has become increasingly prominent, which seriously limits the development of traditional MEMS piezoresistive pressure sensors. In addition, the temperature drift of traditional MEMS piezoresistive pressure sensors is another bottleneck that restricts the sensors' applications in high-end occasions. Existing methods of compensating for sensor temperature drift of the sensor through subsequent circuit increases the overall size and power consumption of the sensor.

SUMMARY

The disclosure aims to solve at least one of the technical problems existing in the prior art, and provide a bipolar transistor type MEMS pressure sensor and a preparation method thereof.

A first aspect of the embodiments of the disclosure provides a bipolar transistor type MEMS pressure sensor, including:
  a thin film, suspended on a substrate through a supporting structure, and configured to deform in different degrees according to pressure suffered;
  a bipolar transistor, including a base region, a collector region and an emitter region, wherein the base region is respectively connected to the collector region and the emitter region, and the base region is disposed on the thin film and is configured to sense deformation of the thin film through a change in resistance value.

Optionally, the base region is disposed at a position of the thin film being close to the supporting structure.

Optionally, the bipolar transistor type MEMS pressure sensor further includes:
  a cantilever beam, disposed on a side face of the thin film and suspended on the supporting structure through the thin film;
  the collector region and the emitter region are located on the cantilever beam;
  the base region includes a sensing area and a connecting area, the sensing area is disposed on the thin film and is respectively connected to the collector region and the emitter region through the connecting area.

Optionally, the bipolar transistor is prepared by ion implantation or doping;

Optionally, the crystal orientation of the sensing area forms an included angle of 45° or 135° with the crystal orientations of the collector region and the emitter region.

Optionally, the thin film includes a first film layer, a supporting layer disposed on the first film layer and a second film layer disposed on the supporting layer, the cantilever beam is disposed on a side face of the second film layer;

Optionally, the bipolar transistor type MEMS pressure sensor further includes a passivation layer, the passivation layer is disposed on a side of the thin film being away from the substrate, and the passivation layer is of the same material and thickness as the supporting layer.

Optionally, the number of the bipolar transistors is two, and the two bipolar transistors are connected in a differential transistor pair mode.

A second aspect of the embodiments of the disclosure provides a preparation method of a bipolar transistor type MEMS pressure sensor, including:
  providing a substrate, the substrate is provided with a first surface and a second surface along a thickness direction, the first surface is provided with a compression area;
  doping on the first surface to form a bipolar transistor, the bipolar transistor includes a base region, a collector region, and an emitter region, the base region is located within the pressure region and is respectively connected to the collector region and the emitter region;
  etching and forming a concave cavity at a corresponding position of the pressure area on the second surface to form a thin film on the substrate corresponding to the concave cavity;
  bonding the second surface with the substrate to form the bipolar transistor type MEMS pressure sensor.

Optionally, the substrate includes a first structural layer, a second structural layer disposed on the first structural layer, and a third structural layer disposed on the second structural layer along the direction of thickness, the cavity is formed in the first structural layer and defines the first structural layer as a first film layer and a supporting structure supporting the first film layer; the method further includes:
  etching the second structural layer to form a supporting layer, the supporting layer is overlapped with the first film layer, and defines the third structural layer as a second film layer overlapped with the supporting layer and a cantilever beam connected to the second film layer, and the collector region and the emitter region are located on the cantilever beam.

Optionally, doping on the first surface to form the bipolar transistor specifically includes:
  carrying out P-type doping on portion of the substrate located outside the compression area to form a collector region;
  carrying out N-type doping on the collector region and the compression area to form a base region, the base region includes a connecting area located on the collector region and a sensing area located within the compression area, and the sensing area is connected to the collector region through the connecting area;

carrying out P-type doping on the connecting area to form an emitter region.

Optionally, the method further includes:

carrying out deposition on the first surface and the bipolar transistor to form a passivation layer, and the passivation layer is of the same material and thickness as the supporting layer.

The above technical solutions of the disclosure have the following beneficial effects:

The bipolar transistor type MEMS pressure sensor in the embodiments of this disclosure does not change the characteristic size of the thin film, but instead adds a bipolar transistor on the thin film. In specific applications, the base region of the bipolar transistor serves as the input end and the collector region serves as the output end. When the pressure changes, the thin film will bend and generate concentrated stress, which will cause changes in the resistance value of the base region. Meanwhile, bipolar transistors have an amplification effect, which can amplify the current changes in the base region into the current changes in the collector region. Therefore, when detecting the pressure to be measured based on the current changes in the collector region, the sensitivity of the sensor can be effectively improved without changing performance indicators such as range and nonlinearity.

The bipolar transistor type MEMS pressure sensor in the embodiment of the present disclosure can simultaneously serve as a pressure sensitive resistor in the base region of the bipolar transistor, thereby improving the integration of the sensor structure and simplifying the preparation process.

The bipolar transistor type MEMS pressure sensor of the present disclosure embodiment can also suppress temperature drift of the sensor in the base region of the bipolar transistor. This is because an increase in temperature leads to a decrease in the resistance value of the base region, resulting in a decrease in the sensor output. However, due to the function of the base region as both the base region of the bipolar transistor and the pressure sensitive resistor of the sensor, a decrease in the resistance value of the pressure sensitive resistor will also lead to an increase in the input current of the base region and the output of the bipolar transistor. Therefore, the output of the sensor can be compensated, and vice versa, This effectively suppresses the temperature drift of the sensor.

Figure 1:
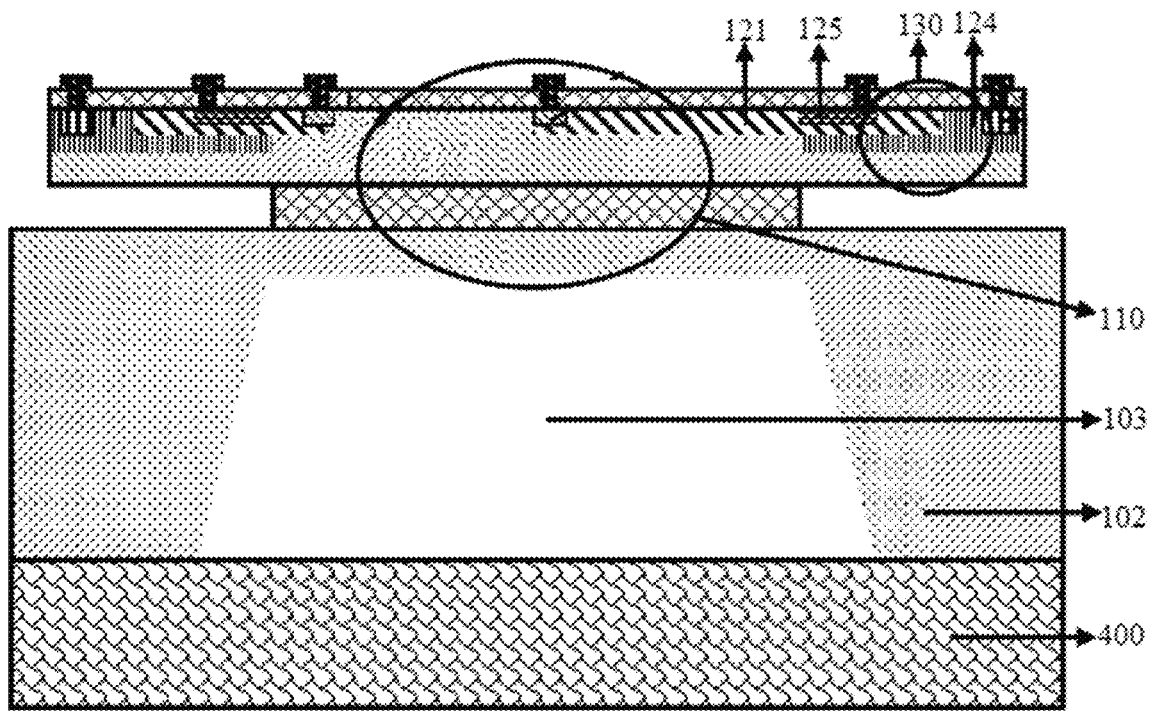
FIG. 1 is a schematic structural diagram of a bipolar transistor type MEMS pressure sensor according to embodiment of the present disclosure.

In the drawings, 100. First structural layer; 101. First thin film layer; 102. Supporting structure; 103. Cavity; 200. Second structural layer; 201. Supporting layer; 300. Third structural layer; 301. Second thin film layer; 400. Substrate; 500. Passivation layer; 501. First lead structure; 502. Second lead structure; 503. Third lead structure; 110. Thin film; 121. Base region; 122. Connecting area; 123. Sensing area; 124. Collector region; 125. Emitter region; 126. First electrode extraction area; 127. Second electrode extraction area; and 130. Cantilever beam.

DETAILED DESCRIPTION OF THE EMBODIMENTS

The implementation modes of the disclosure are further described in detail below in conjunction with the accompanying drawings and the embodiments. The following detailed description of the embodiments and the accompanying drawings serve to illustrate the principle of the disclosure, but are not intended to limit the scope of the disclosure, that is, the disclosure is not limited to the described embodiments.

In the description of the disclosure, it should be noted that, unless otherwise stated, "a plurality of" means more than one; orientations or positional relationships indicated by terms, such as "upper", "lower", "left", "right", "inner" and "outer" are to facilitate the description of the disclosure and simplify the description merely, do not indicate or imply that the referred apparatuses or elements must have specific orientations and are constructed and operated in the specific orientations and thus should not be construed to limit the disclosure. In addition, the terms "first" and "second" are only adopted for description and should not be understood to indicate or imply relative importance. "Vertical" is not vertical in the strict sense, but within the allowable range of error. "Parallel" is not parallel in the strict sense, but within the allowable range of error.

In the description of the disclosure, it is to be noted that unless otherwise definitely specified and limited, terms "install", "mutually connect" and "connect" should be broadly understood. For example, the terms may refer to fixed connection and may also refer to detachable connection or integration. The terms may refer to direct connection, may also refer to indirect connection through a medium. The specific meanings of above terms in the disclosure may be understood in specific cases to those of ordinary skill in the art.

For a better understanding of the disclosure, the embodiments of the disclosure will be described below in combination with FIGS. 1-13.

FIG. 1 is a schematic structural diagram of a bipolar transistor type MEMS pressure sensor of the embodiments of the disclosure.

Referring to FIG. 1, the embodiment of the disclosure provide a bipolar transistor type MEMS pressure sensor, which includes: a thin film 110, which is suspended on a substrate 400 through a supporting structure 102, and configured to deform in different degrees according to pressure suffered; a bipolar transistor, including a base region 121, a collector region 124 and an emitter region 125, the base region 121 is respectively connected to the collector region 124 and the emitter region 125, and the base region 121 is disposed on the thin film 110 and is configured to sense the deformation of the thin film 110 through a change in resistance value.

The bipolar transistor type MEMS pressure sensor in the embodiment of this disclosure does not change the characteristic size of the thin film 110, but instead adds a bipolar transistor on the thin film 110. In specific applications, the base region 121 of the bipolar transistor is used as the input end, and the collector region 124 is used as the output end. When the pressure changes, the thin film 110 will bend and generate concentrated stress, which will cause the resistance value of the base region 121 to change. At the same time, bipolar transistors have an amplification effect, which can amplify the current changes in the base region 121 to the current changes in the collector region 124. Therefore, when detecting the pressure to be measured based on the current changes in the collector region 124, the sensitivity of the sensor can be effectively improved without changing performance indicators such as range and nonlinearity.

The bipolar transistor type MEMS pressure sensor in the embodiment of this disclosure can simultaneously serve as a pressure sensitive resistor in the base region 121 of the bipolar transistor, thereby improving the integration of the sensor structure and simplifying the preparation process.

The bipolar transistor type MEMS pressure sensor in the embodiment of this disclosure can also suppress temperature drift of the sensor in the base region 121 of the bipolar transistor. This is because an increase in temperature leads to a decrease in the resistance of the base region 121, resulting in a decrease in the sensor output. However, since the base region 121 functions as both the base region 121 of the bipolar transistor and the pressure sensitive resistor of the sensor, a decrease in the resistance of the pressure sensitive resistor will also lead to an increase in the input current of the base region 121 and the output of the bipolar transistor, thus compensating for the output of the sensor, and vice versa, This effectively suppresses the temperature drift of the sensor.

In some embodiments, the thin film 110 is formed by forming a cavity 103 in the substrate.

It can be understood that after the formation of a cavity 103 in the substrate, the portion of the substrate thinned by the cavity 103 is the thin film 110, and the thickness of the thin film 110 can be limited by the depth of the cavity 103.

In some embodiments, the substrate is a silicon substrate, a germanium substrate, an SOI substrate, or a GeOI substrate, etc. In the embodiments of the disclosure, the substrate is preferably the SOI substrate.

In some embodiments, the cavity 103 is formed by dry etching or wet etching. In the embodiments of the disclosure, the cavity 103 is preferably formed by wet etching.

In some embodiments, the bipolar transistor is a PNP or NPN transistor. In the embodiments of the disclosure, the bipolar transistor is preferably a PNP transistor.

In some embodiments, the bipolar transistor is prepared in an ion implantation or doping mode. In the embodiments of the disclosure, the bipolar transistor is preferably prepared in a doping mode.

In some embodiments, the base region 121 is disposed at a position, close to the supporting structure 102, of the thin film 110.

It can be understood that placing the base region 121 near the support structure 102 of the thin film 110 can achieve maximum sensitivity of the sensor. This is due to the maximum concentrated stress generated at the edge of the thin film 110 under pressure, and the maximum current change generated when the base region 121 is located at this position. Therefore, placing the base region 121 near the support structure 102 of the thin film 110 can achieve maximum sensitivity of the sensor.

In some embodiments, the bipolar transistor type MEMS pressure sensor further includes a cantilever beam 130; the cantilever beam 130 is disposed on a side face of the thin film 110 and suspended on the supporting structure 102 through the thin film 110; the collector region 124 and the emitter region 125 are disposed on the cantilever beam 130; the base region 121 includes a sensing area 123 and a connecting area 122, the sensing area 123 is disposed on the thin film 110 and is respectively connected to the collector region 124 and the emitter region 125 through the connecting area 122.

It can be understood that due to the different material thermal expansion coefficients between the support structure 102 and the substrate 400, a temperature dependent thermal stress will be generated at the interface. This thermal stress will be transmitted to the bipolar transistor through the thin film 110, resulting in zero drift of the sensor. Due to the suspended setting, the thermal stress transmitted from the support structure 102 to the cantilever beam 130 can be reduced. Therefore, the partial structure of the bipolar transistor located on the cantilever beam 130 is less affected by thermal stress, and the overall thermal stress of the bipolar transistor is reduced, thereby reducing the zero drift caused by stress.

In some embodiments, the thin film 110 includes a first film layer 101, a supporting layer 201 disposed on the first film layer 101 and a second film layer 301 disposed on the supporting layer 201, and the cantilever beam 130 is disposed on the side face of the second film layer 301.

For example, the cantilever beam 130 is integrally formed with the second film layer 301, and the supporting layer 201 and the cantilever beam 130 can be formed by etching the part, located on the periphery of the supporting layer 201, of the substrate.

For example, the material of the supporting layer 201 is different from those of the first film layer 101 and the second film layer 301.

For example, the materials of the first film layer 101 and the second film layer 301 are both monocrystalline silicon, and the material of the supporting layer 201 is silicon oxide. Therefore, the supporting layer 201 and the cantilever beam 130 can be formed by etching the substrate in a wet etching mode.

In some embodiments, the crystal orientation of the sensing area 123 forms an included angle of 45° or 135° with the crystal orientations of the collector region 124 and the emitter region 125.

It can be understood that due to the doping or ion implantation method used to prepare the collector region 124, base region 121, and emitter region 125 of bipolar transistors, there is a certain piezoresistive effect in each region of the bipolar transistor. Therefore, under pressure, the resistance values of each region will change, which will lead to additional output of the bipolar transistor and affect detection accuracy. Based on the close correlation between piezoresistive effect and crystal orientation, this embodiment can reduce the resistance changes of the collector region 124 and emitter region 125 under stress by limiting the crystal orientation of the base 121 region, collector region 124, and emitter region 125, thereby reducing the additional output of the bipolar transistor and improving the sensitivity of the sensor.

In some embodiments, the bipolar transistor type MEMS pressure sensor also includes a passivation layer 500, which is located on the side of the second film layer 301 away from the substrate 400, and the material and thickness of the passivation layer 500 are the same as the support layer 201.

It can be understood that the material and thickness of the passivation layer 500 are the same as the support layer 201, which can achieve stress compensation.

In some embodiments, the passivation layer 500 is provided with a first lead structure 501, a second lead structure 502 and a third lead structure 503. The first lead structure 501, the second lead structure 502 and the third lead structure 503 are respectively connected to the sensing area 123, the collector region 124 and the emitter region 125.

It can be understood that the first lead structure 501, the second lead structure 502, and the third lead structure 503 are used for electrode extraction in the sensing section 123, the collecting area 124, and the emission area 125, respectively.

In some embodiments, the materials of the first lead structure 501, the second lead structure 502, and the third lead structure 503 are the same, and can be at least one of aluminum, copper, platinum, titanium, gold, etc.

In some embodiments, the collector region 124 is provided with a first electrode extraction area 126, the collector region 124 is connected to the second lead structure 502 through the first electrode extraction area 126, the sensing area 123 is provided with a second electrode extraction area 127, and the sensing area 123 is connected to the first lead structure 501 through the second electrode extraction area 127. The first electrode extraction area 126 and the second electrode extraction area 127 are both formed by in a heavy doping mode, which can improve the conductivity.

In some embodiments, the number of the bipolar transistors is two, and the two bipolar transistors are respectively located on two opposite ends of the thin film 110 and are connected in a differential transistor pair mode.

It can be understood that the shape, size and doping concentration of each area of the two bipolar transistors are the same, for the purpose of obtaining two bipolar transistors with completely the same performance, and the sensing areas 123 of the two bipolar transistors are perpendicular to each other, so that the pressure-sensitive resistor can obtain equal and opposite resistance changes under the action of pressure. Through connection in a differential transistor pair mode, the common-mode interference of the sensor can be reduced and the sensitivity can be improved.

The embodiments of the disclosure further provide a preparation method of a bipolar transistor type MEMS pressure sensor, which includes the following steps.

Figure 2:
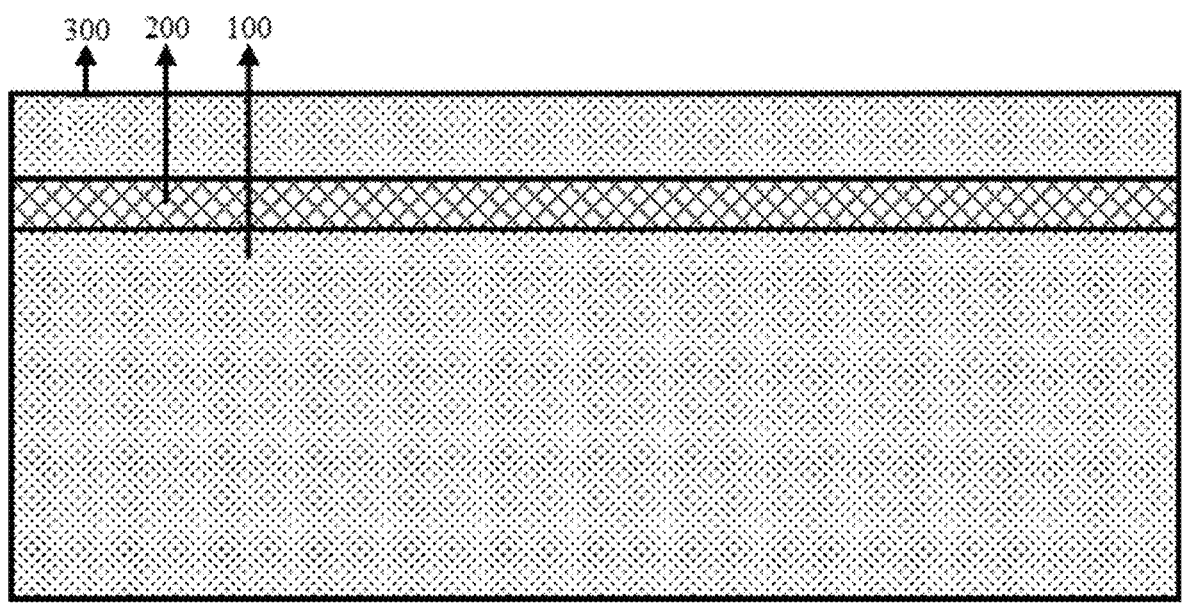
FIGS. 2-13 are a preparation process of a bipolar transistor type MEMS pressure sensor according to embodiments of the present disclosure.
Figure 3:
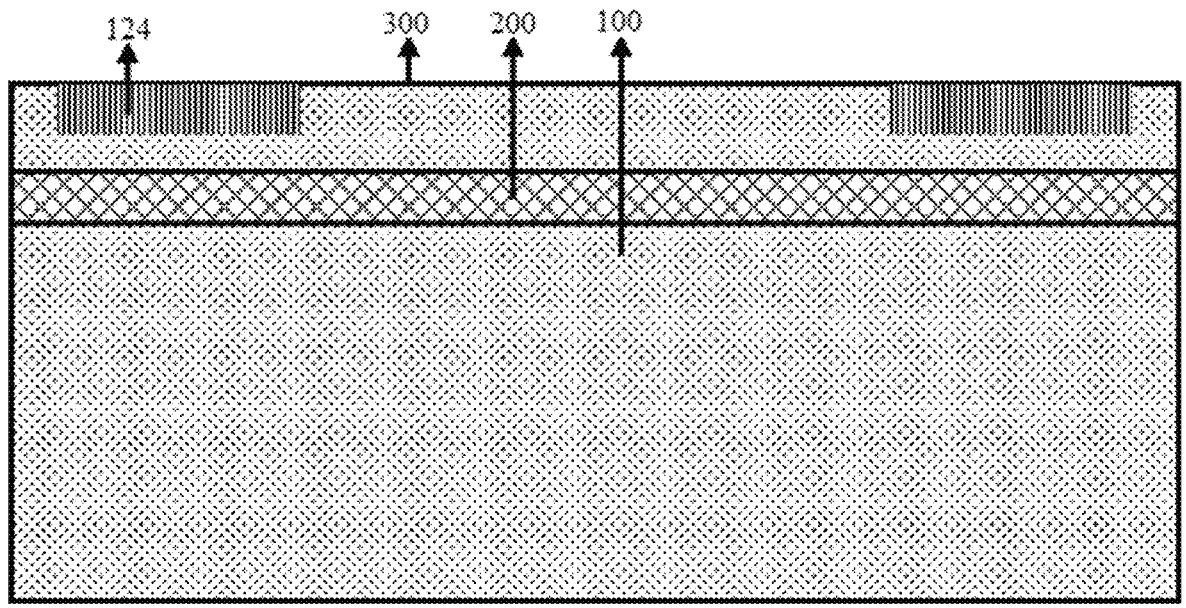
Figure 4:
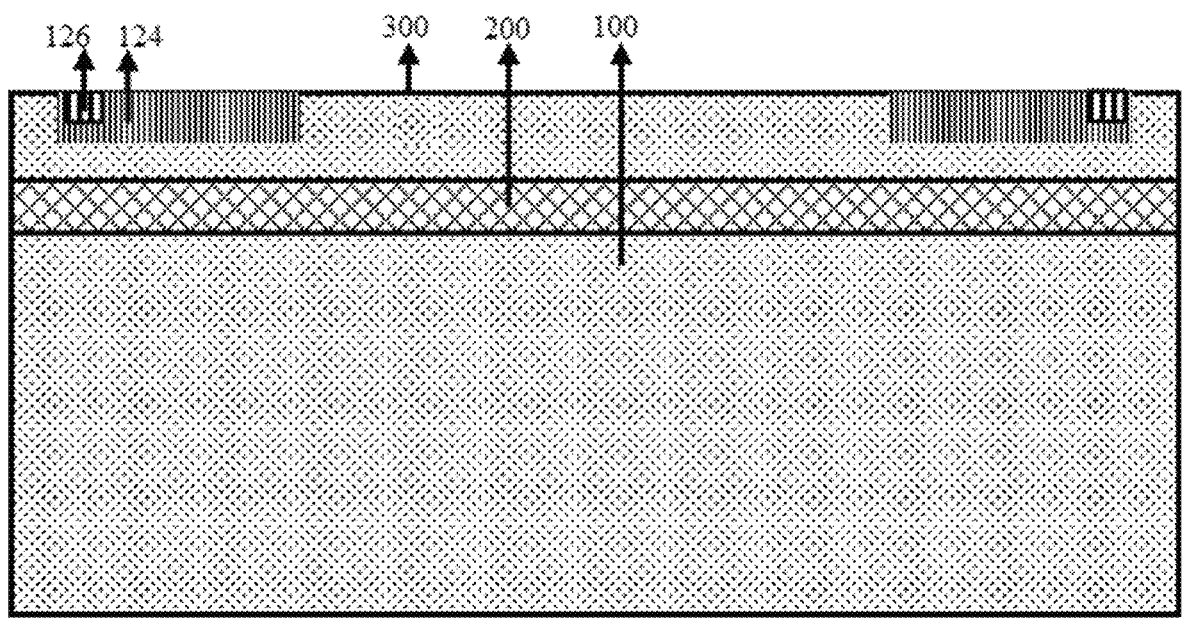
Figure 5:
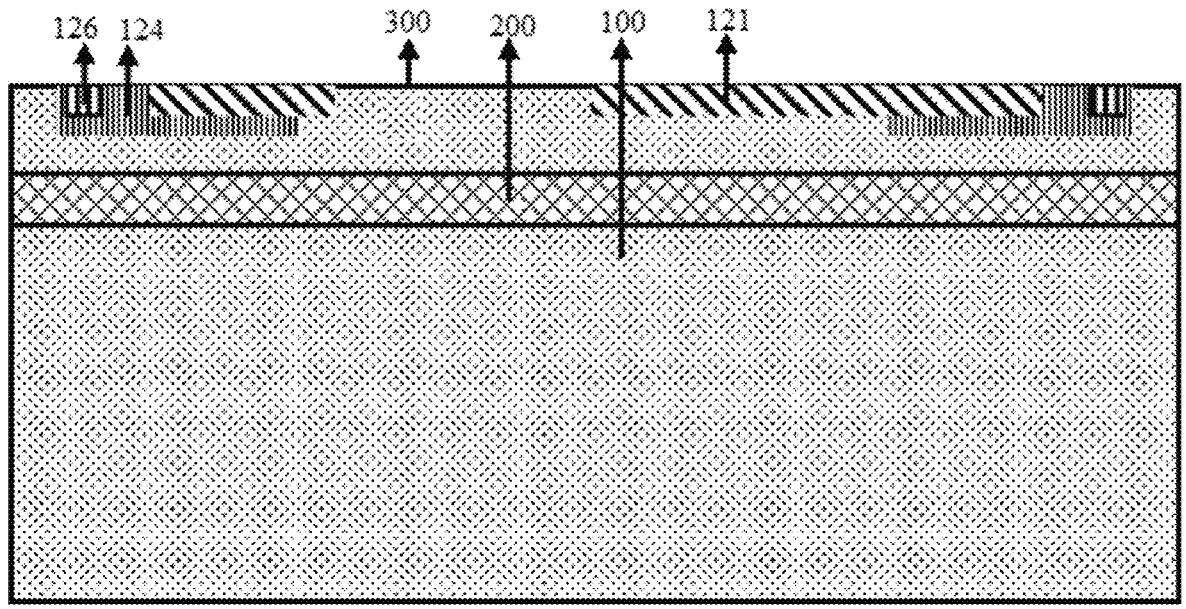
Figure 6:
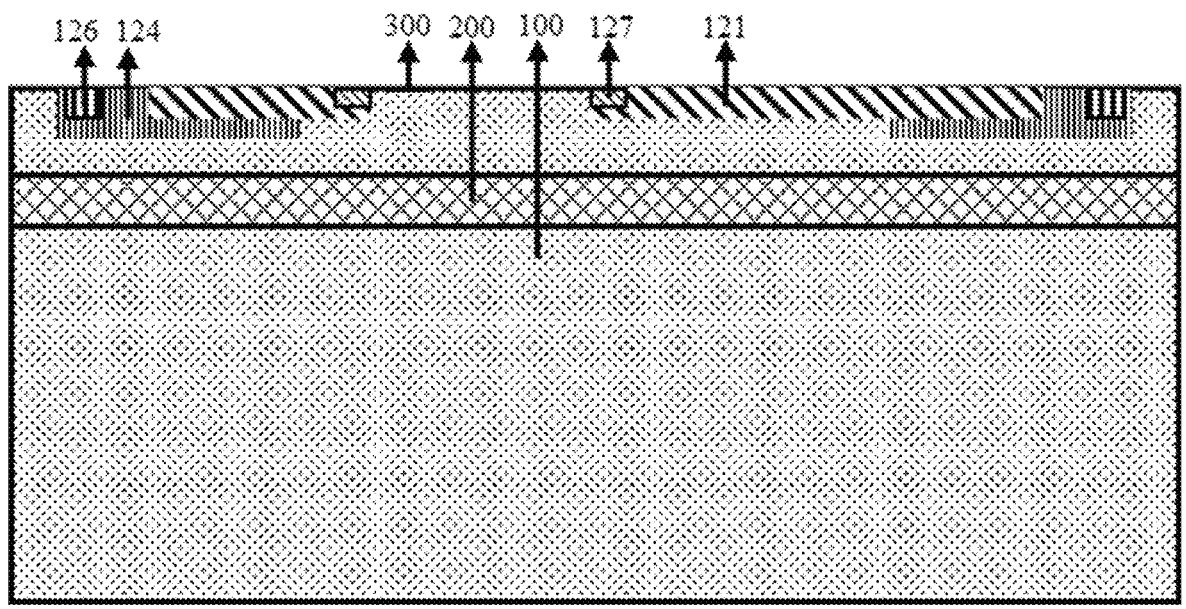

Step 1, as shown in FIG. 2, providing a substrate, the substrate is provided with a first surface and a second surface along a thickness direction of, and the first surface is provided with a compression area. Optionally, the substrate is a silicon substrate, a germanium substrate, an SOI substrate, or a GeOI substrate, etc. In the embodiments of the disclosure, the substrate is preferably the SOI substrate.

Step 2, as shown in FIGS. 3-8, doping on the first surface to forms a bipolar transistor. The bipolar transistor includes a base region 121, a collector region 124, and an emitter region 125. The base region 121 is located within the pressure region and is connected to the collector region 124 and emitter region 125, respectively.

Figure 12:
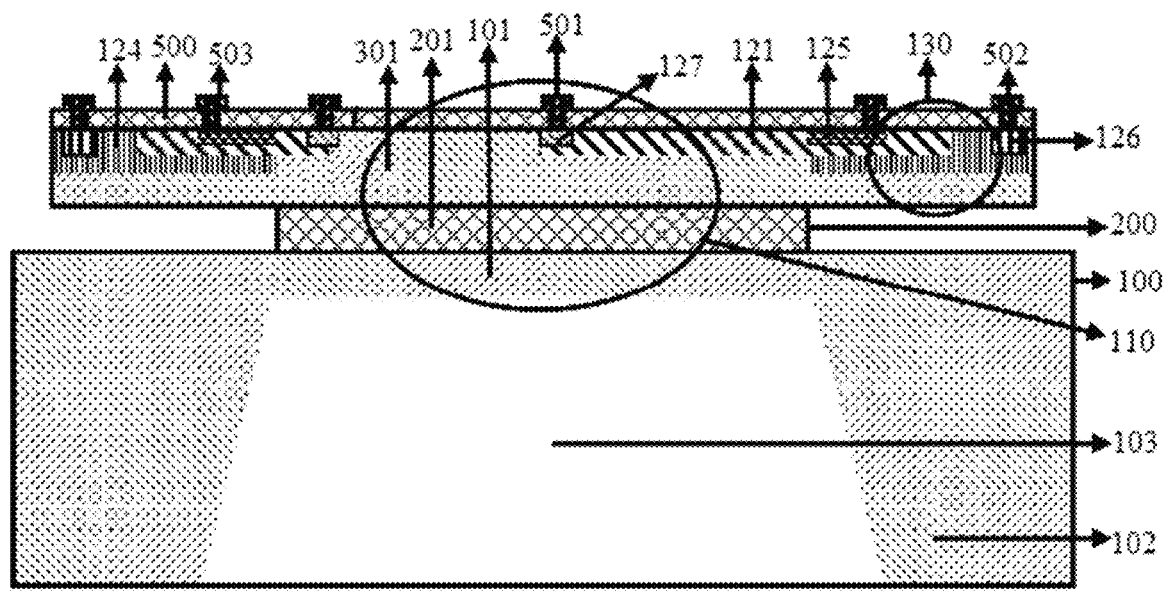

Step 3, as shown in FIG. 12, etching the corresponding pressure area on the second surface to form a concave cavity 103, so as to form a thin film 110 on the corresponding concave cavity 103 of the substrate.

Figure 13:
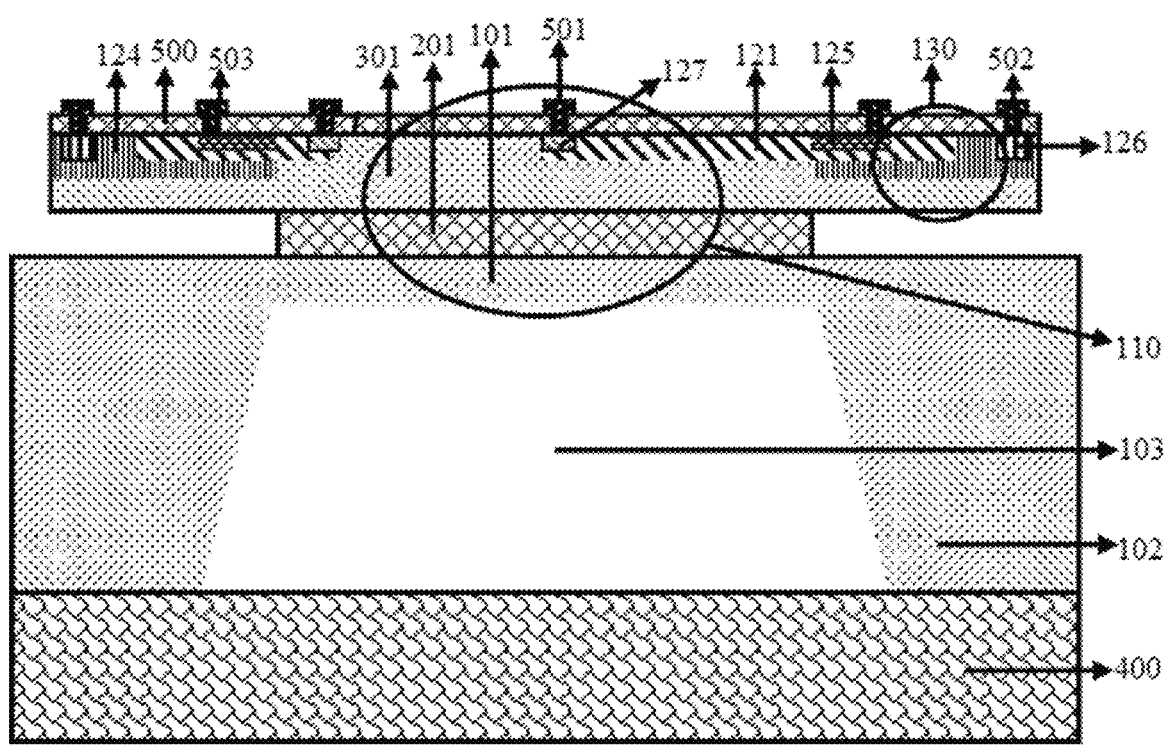

Step 4, as shown in FIG. 13, bonding the second surface to substrate 400 to form a bipolar transistor type MEMS pressure sensor. Optionally, the material of the substrate 400 is monocrystalline silicon or glass with a thickness of 200-2000 μm.

In some embodiments, the substrate is of a multi-layer structure, including a first structural layer 100, a second structural layer 200 disposed on the first structural layer 100, and a third structural layer 300 disposed on the second structural layer 200, as shown in FIG. 2.

For example, the material of the first film layer 101 is monocrystalline silicon or glass, and the thickness of the first film layer 101 is 100-1000 nm. The material of the supporting layer 201 is silicon oxide and silicon nitride, and the thickness of the supporting layer 201 is 100-1000 nm. The material of the second film layer 301 is monocrystalline silicon or germanium, and the thickness of the second film layer 301 is 0.1-100 μm.

Figure 7:
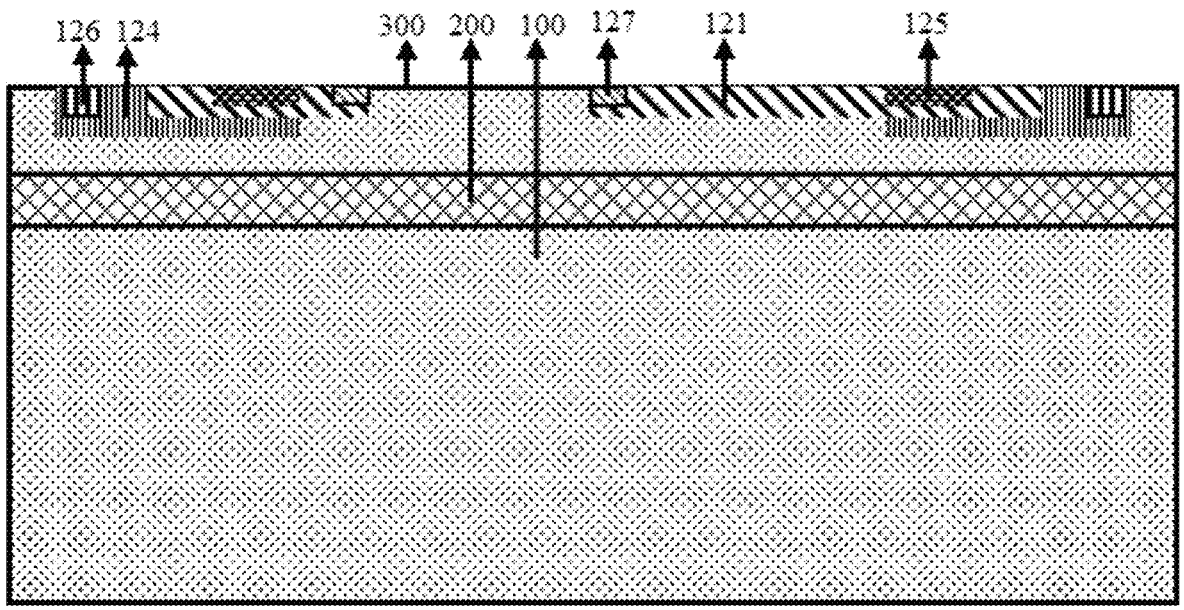

For example, a bipolar transistor is formed on one side of the third structural layer 300 facing away from the second structural layer 200, as shown in FIG. 7. The concave cavity 103 is formed on one side of the first structural layer 100 facing away from the second structural layer 200, and the first structural layer 100 is limited to the first film layer 101 and the support structure 102 supporting the first film layer 101. The first film layer 101 is the part of the first structural layer 100 that has been thinned by the concave cavity 103, as shown in FIG. 12.

In some embodiments, the bipolar transistor is an NPN type or a PNP type transistor. In the embodiments of the disclosure, the bipolar transistor is preferably a PNP type transistor.

In some embodiments, the bipolar transistor is prepared by ion implantation or doping. In the embodiments of the disclosure, the bipolar transistor is preferably prepared by doping.

In some embodiments, as shown in FIGS. 3-8, the steps for forming the bipolar transistor include:
  P-type doping is carried out on the portion of the substrate located outside the compression area to form the collector region 124;
  P-type heavy doping is carried out on the collector region 124 to form a first electrode extraction area 126;
  N-type doping is carried out on the collector region 124 and the compression area to form the base region 121, the base region 121 includes a connecting area 122 located on the collector region 124 and a sensing area 123 located in the compression area, and the sensing area 123 is connected to the collector region 124 through the connecting area 122;
  N-type heavy doping is carried out on the sensing area 123 of the base region 121 to form a second electrode extraction area 127.
  P-type doping is carried out on the connecting area 122 to form the emitter region 125.

In specific application, the base region 121 and the collector region 124 are respectively connected to corresponding lead structures through the second electrode extraction area 127 and the first electrode extraction area 126, which can improve the conductivity.

Figure 8:
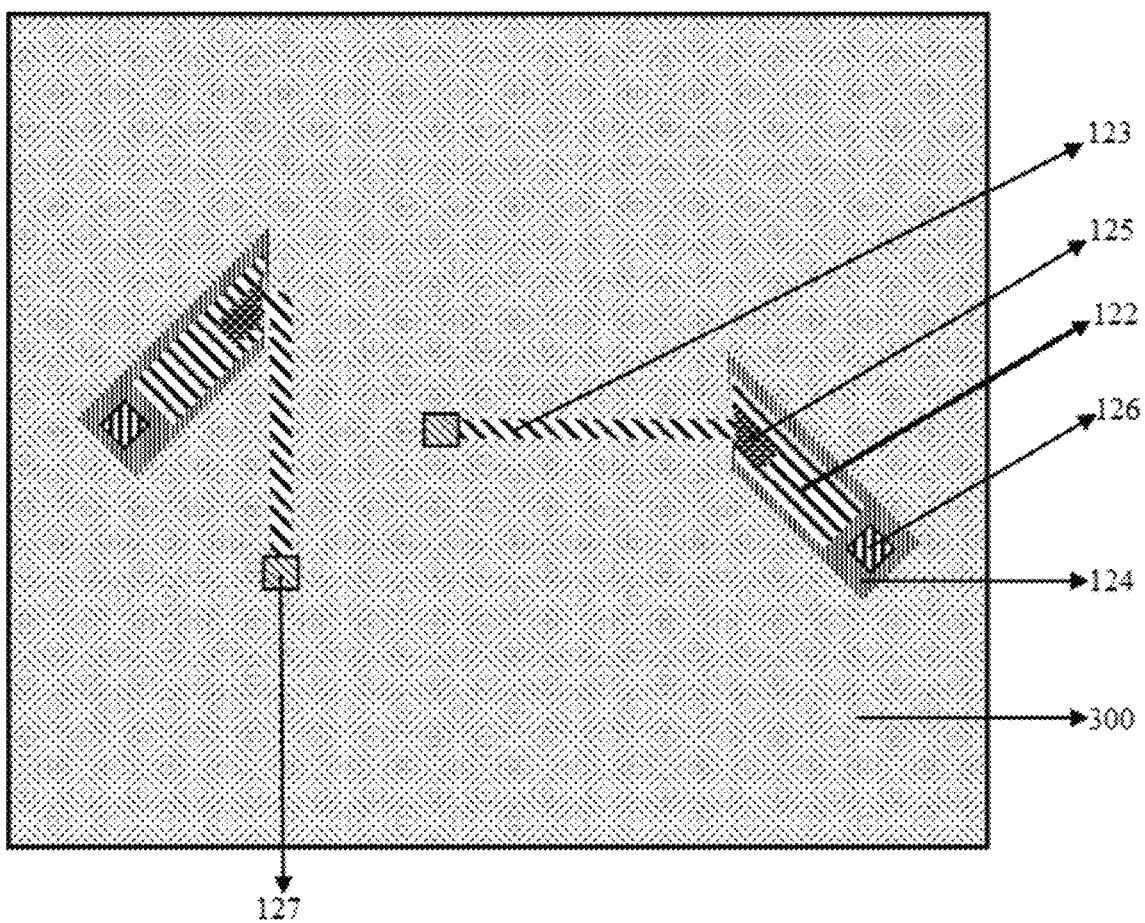
Figure 9:
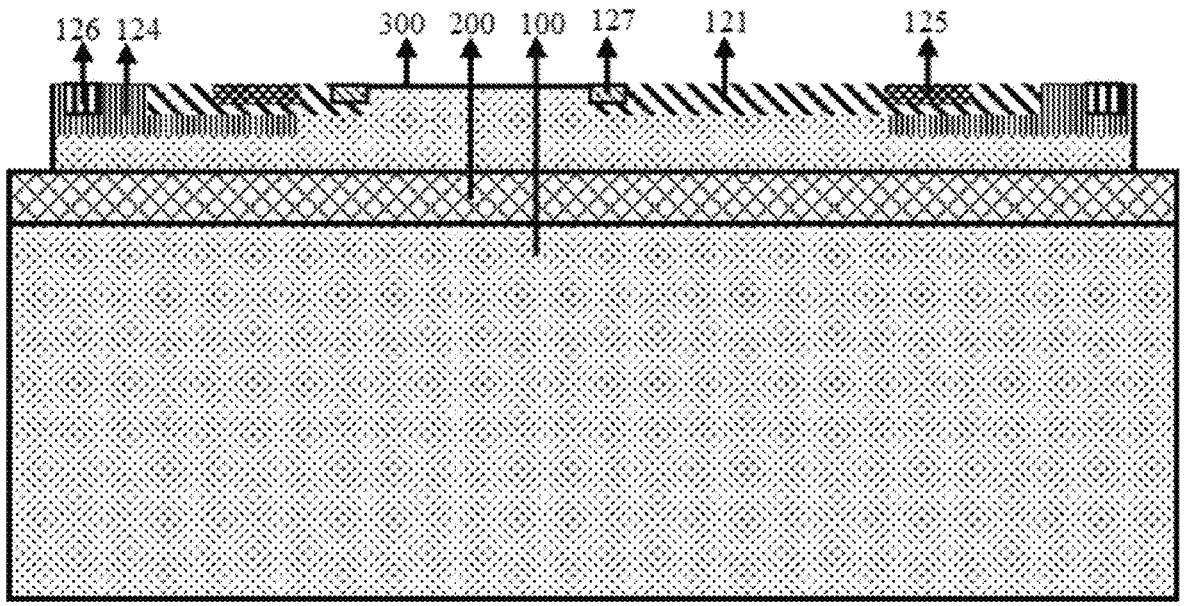
Figure 10:
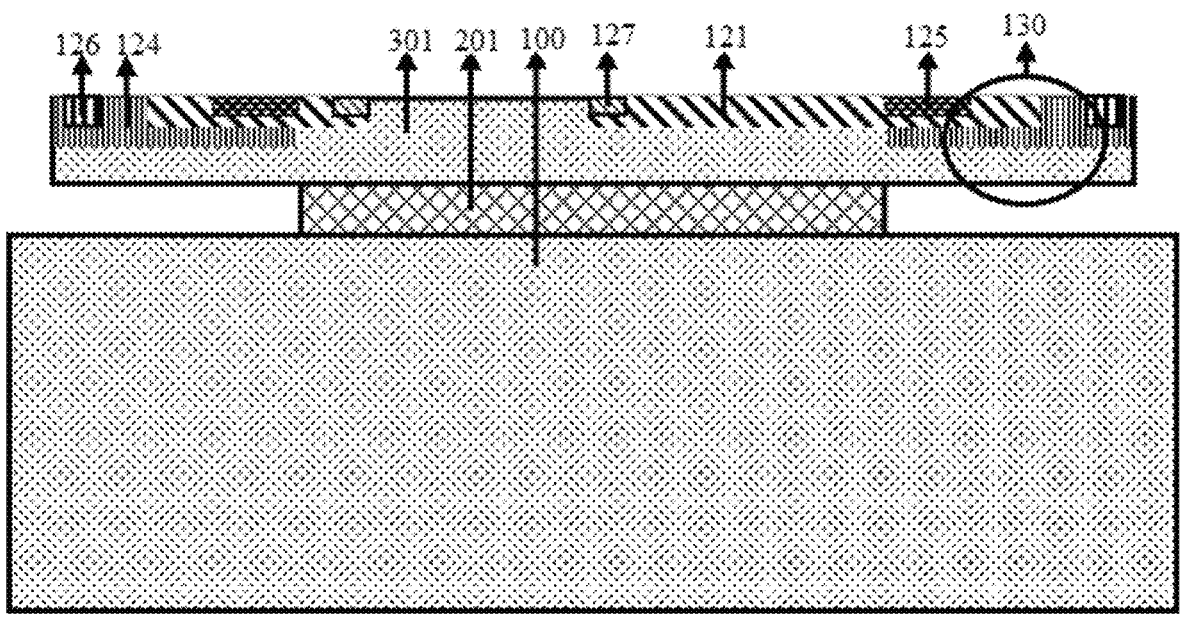
Figure 11:
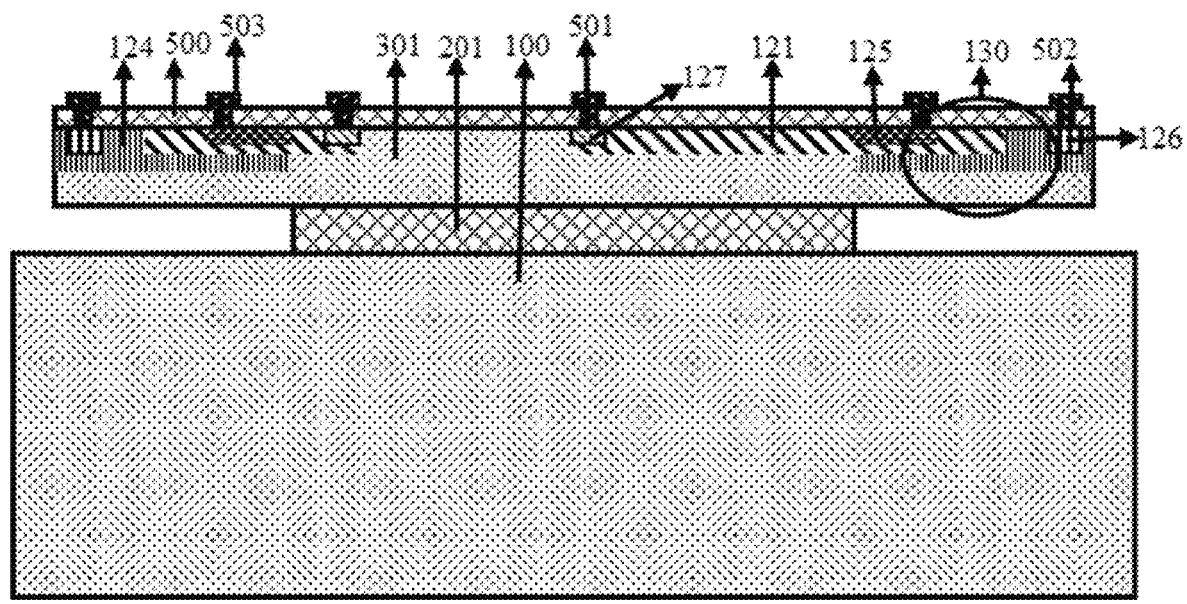

In some embodiments, the crystal orientation of the sensing area 123 forms an included angle of 45° or 135° with the crystal orientations of the collector region 124 and the emitter region 125, as shown in FIG. 8.

It can be understood that due to the doping or ion implantation method used to prepare the collector region 124, base region 121, and emitter region 125 of bipolar transistors, there is a certain piezoresistive effect in each region of the bipolar transistor. Therefore, under pressure, the resistance values of each region will change, which will lead to additional output of the bipolar transistor and affect detection accuracy. Based on the close correlation between piezoresistive effect and crystal orientation, this embodiment can reduce the resistance changes of the collector region 124 and emitter region 125 under stress by limiting the crystal orientation of the base region 121, collector region 124, and emitter region 125, thereby reducing the additional output of the bipolar transistor and improving the sensitivity of the sensor.

In some embodiments, the sensing area 123 is disposed at the edge of the compression area, as shown in FIG. 8.

It can be understood that under the action of pressure, the concentrated stress generated by the edge of the thin film 110 is the maximum, therefore, the current change generated when the sensing area 123 is located at this position is the maximum, and therefore, the sensor can obtain maximum sensitivity.

In some embodiments, the number of the bipolar transistors is two, and the two bipolar transistors are respectively located on two opposite ends of the thin film 110 and are connected in a differential transistor pair mode.

It can be understood that through connection in a differential transistor pair mode, the common-mode interference of the sensor can be reduced and the sensitivity can be improved. Meanwhile, in order to enable the pressure-sensitive resistor to obtain equal and opposite resistance changes under the action of pressure, the sensing areas 123 of the two bipolar transistors are perpendicular to each other.

In some embodiments, the cavity 103 is formed in a wet etching mode, and the depth of the cavity 103 is 10-500 μm.

In some embodiments, the preparation method further includes a step of forming a cantilever beam 130 on the side face of the thin film 110, including:
  etching the second structural layer 200 to form a supporting layer 201, the supporting layer 201 is overlapped with the first thin film layer 101, and defines the third structural layer 300 as a second thin film layer 301 overlapped with the supporting layer 201 and the cantilever beam 130 connected to the second thin film layer 301, and the collector region 124 and the emitter region 125 are located on the cantilever beam 130.

It can be understood that the thin film 110 is formed by the second film layer 301, the supporting layer 201 and the first film layer 101.

It also can be understood that due to the different thermal expansion coefficients of materials of the supporting structure 102 and the substrate 400, thermal stress varying with temperature will be generated at an interface, and the thermal stress may be transferred to the bipolar transistor through the thin film 110, thus resulting in zero drift of the sensor. Due to suspension arrangement, the stress transferred from the supporting structure 102 to the cantilever beam 130 can be reduced, so the partial structure of the bipolar transistor located on the cantilever beam 130 is less affected by the thermal stress, the thermal stress suffered by the bipolar transistor as a whole is reduced, and therefore, the zero drift caused by stress can be reduced.

In some embodiments, etching the second structural layer 200 to form a supporting layer 201 specifically includes the following steps:
  etching the third structural layer 300 to form a corrosion window.
  wet etching the second structural layer 200 through the corrosion window to form the supporting layer 201.

In some embodiments, the preparation method further includes a step of forming a passivation layer 500, including:
  deposition is carried out on the first surface and the bipolar transistor to form the passivation layer 500, and the passivation layer 500 is of the same material and thickness as the supporting layer 201.

It can be understood that the passivation layer 500 can isolate components on the surface of the sensor from the outside to play a protective role. Meanwhile, the passivation layer 500 is of the same material and thickness as the supporting layer 201, so that stress compensation can be realized. Optionally, the material of the passivation layer 500 is at least one of silicon oxide and silicon nitride.

In some embodiments, the preparation method further includes a step of forming lead structures, including:
  etching the passivation layer 500 to form a first opening, a second opening and a third opening.
  deposition is carried out on the first opening, the second opening and the third opening respectively to form a first lead structure 501, a second lead structure 502 and a third lead structure 503. The first lead structure 501, the second lead structure 502 and the third lead structure 503 are connected to the sensing area 123, the collector region 124 and the emitter region 125, respectively.

It can be understood that the first lead structure 501, the second lead structure 502 and the third lead structure 503 are respectively configured for electrode extraction of the base region 121, the collector region 124 and the emitter region 125, respectively. Optionally, the first lead structure 501, the second lead structure 502 and the third lead structure 503 are made of metal, which is preferably at least one of aluminum, copper, platinum, titanium, gold, etc.

The bipolar transistor type MEMS pressure sensor prepared by the above method did not change the characteristic size of the thin film 110, but instead added a bipolar transistor on the thin film 110. In specific applications, the base region 121 of the bipolar transistor is used as the input end, and the collector region 124 is used as the output end. When the pressure changes, the thin film 110 will bend and generate concentrated stress, which will cause the resistance value of the base region 121 to change. At the same time, bipolar transistors have an amplification effect, which can amplify the current changes in the base region 121 to the current changes in the collector region 124. Therefore, when detecting the pressure to be measured based on the current changes in the collector region 124, the sensitivity of the sensor can be effectively improved without changing performance indicators such as range and nonlinearity.

The bipolar transistor type MEMS pressure sensor prepared by the above method can also serve as a pressure sensitive resistor in the base region 121 of the bipolar transistor, thereby improving the integration of the sensor structure and simplifying the preparation process.

The bipolar transistor type MEMS pressure sensor prepared by the above method can also suppress the temperature drift of the sensor in the base region 121 of the bipolar transistor. This is because an increase in temperature leads to a decrease in the resistance of the base region 121, resulting in a decrease in the sensor output. However, since the base region 121 functions as both the base region 121 of the bipolar transistor and the pressure sensitive resistor of the sensor, a decrease in the resistance of the pressure sensitive resistor will also lead to an increase in the input current of the base region 121 and the output of the bipolar transistor, thus compensating for the output of the sensor, and vice versa, This effectively suppresses the temperature drift of the sensor.

The embodiments of this application have been described above in conjunction with the accompanying drawings, but this application is not limited to the specific embodiments mentioned above. The specific embodiments mentioned above are only illustrative and not restrictive. With the inspiration of this application, ordinary technical personnel in the art can also make many forms that fall within the protection scope of this application, without departing from the purpose and claims protected by this application.

What is claimed is:

1. A bipolar transistor type MEMS pressure sensor, including:
a thin film, suspended on a substrate through a supporting structure, and configured to deform in different degrees according to pressure suffered;
a cantilever beam, disposed on the side face of the thin film and suspended on the supporting structure through the thin film;
a bipolar transistor, including a base region, a collector region and an emitter region, the collector region and the emitter region are disposed on the cantilever beam, the base region is disposed at a position, close to the supporting structure, of the thin film, the base region includes a sensing area and a connecting area, the sensing area is disposed on the thin film and is respectively connected to the collector region and the emitter region through the connecting area, and the base region is configured to sense the deformation of the thin film through a change in resistance value;
a preparation method of the bipolar transistor type MEMS pressure sensor includes:
providing a substrate, the substrate includes a first structural layer, a second structural layer disposed on the first structural layer, and a third structural layer disposed on the second structural layer along a thickness direction, and the substrate is provided with a first surface and a second surface, the first surface is provided with a compression area;
doping on the first surface to form a bipolar transistor, the bipolar transistor includes a base region, a collector region, and an emitter region, the base region is located within the pressure region and is respectively connected to the collector region and the emitter region; etching and forming a concave cavity at a corresponding position of the pressure area on the second surface to form a thin film on the substrate corresponding to the concave cavity; the cavity is formed in the first structural layer, and defines the first structural layer as a first thin film layer and a supporting structure supporting the first thin film layer;
etching the second structural layer to form a supporting layer, the supporting layer is overlapped with the first thin film layer, and defines the third structural layer as a second thin film layer overlapped with the supporting layer and a cantilever beam connected to the second thin film layer, and the collector region and the emitter region are located on the cantilever beam;
bonding the second surface with the substrate to form the bipolar transistor type MEMS pressure sensor.

2. The bipolar transistor type MEMS pressure sensor according to claim 1, wherein the bipolar transistor is prepared by ion implantation or doping;
the crystal orientation of the sensing area forms an included angle of 45° or 135° with the crystal orientations of the collector region and the emitter region.

3. The bipolar transistor type MEMS pressure sensor according to claim 1, wherein the thin film includes a first film layer, a supporting layer disposed on the first film layer and a second film layer disposed on the supporting layer, and the cantilever beam is disposed on the side face of the second film layer;
the bipolar transistor type MEMS pressure sensor further includes a passivation layer, the passivation layer is disposed on a side of the thin film being away from the substrate, and the passivation layer is of the same material and thickness as the supporting layer.

4. The bipolar transistor type MEMS pressure sensor according to claim 1, wherein the number of the bipolar transistors is two, and the two bipolar transistors are connected in a differential transistor butting mode.

5. A preparation method of a bipolar transistor type MEMS pressure sensor, including:
providing a substrate, the substrate includes a first structural layer, a second structural layer disposed on the first structural layer, and a third structural layer disposed on the second structural layer along a thickness direction, and the substrate is provided with a first surface and a second surface, the first surface is provided with a compression area;
doping on the first surface to form a bipolar transistor, the bipolar transistor includes a base region, a collector region, and an emitter region, the base region is located within the pressure region and is respectively connected to the collector region and the emitter region;
etching and forming a concave cavity at a corresponding position of the pressure area on the second surface to form a thin film on the substrate corresponding to the concave cavity; the cavity is formed in the first structural layer, and defines the first structural layer as a first thin film layer and a supporting structure supporting the first thin film layer;
etching the second structural layer to form a supporting layer, the supporting layer is overlapped with the first thin film layer, and defines the third structural layer as a second thin film layer overlapped with the supporting layer and a cantilever beam connected to the second thin film layer, and the collector region and the emitter region are located on the cantilever beam;
bonding the second surface with the substrate to form the bipolar transistor type MEMS pressure sensor.

6. The method according to claim 5, wherein doping on the first surface to form a bipolar transistor includes:
carrying out P-type doping on portion of the substrate located outside the compression area to form a collector region;
carrying out N-type doping on the collector region and the compression area to form a base region, the base region includes a connecting area located on the collector region and a sensing area located within the compression area, and the sensing area is connected to the collector region through the connecting area;
carrying out P-type doping on the connecting area to form an emitter region.

7. The method according to claim 5, further including:
carrying out deposition on the first surface and the bipolar transistor to form a passivation layer, and the passivation layer is of the same material and thickness as the supporting layer.

* * * * *